United States Patent
Dominic

(12) 
(10) Patent No.: US 6,975,253 B1
(45) Date of Patent: Dec. 13, 2005

(54) SYSTEM AND METHOD FOR STATIC HUFFMAN DECODING

(75) Inventor: Pushparaj Dominic, Bangalore (IN)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/913,172

(22) Filed: Aug. 6, 2004

(51) Int. Cl.$^7$ ............................................. H03M 7/40
(52) U.S. Cl. .......................................... 341/65; 341/67
(58) Field of Search ............... 341/65, 67; 375/240.12, 375/240.22; 382/246; 704/219, 500; 707/101

(56) References Cited

U.S. PATENT DOCUMENTS

| | | | | |
|---|---|---|---|---|
| 5,329,313 A | * | 7/1994 | Keith ..................... | 375/240.22 |
| 5,420,639 A | * | 5/1995 | Perkins .................. | 375/240.12 |
| 5,615,020 A | * | 3/1997 | Keith ..................... | 382/246 |
| 5,748,121 A | * | 5/1998 | Romriell ................. | 341/65 |
| 5,848,195 A | * | 12/1998 | Romriell ................. | 382/246 |
| 5,973,626 A | * | 10/1999 | Berger et al. ............ | 341/65 |
| 6,484,142 B1 | * | 11/2002 | Miyasaka et al. .......... | 704/500 |
| 6,622,145 B2 | * | 9/2003 | Kerofsky ................. | 707/101 |
| 6,662,154 B2 | * | 12/2003 | Mittal et al. ............ | 704/219 |
| 6,741,191 B2 | * | 5/2004 | Jang et al. .............. | 341/65 |

\* cited by examiner

Primary Examiner—Patrick Wamsley
(74) Attorney, Agent, or Firm—Global IP Services, PLLC; Prakash Nama

(57) ABSTRACT

The proposed technique uses basic properties of a Huffman codebook to decode a coded data bit stream having a plurality of variable length codewords based on the Huffman codebook. This is achieved by sorting codewords in the Huffman codebook based on potential values. The potential values are computed using the basic parameters of the codewords in the Huffman codebook. A current bit sequence having a predetermined length is extracted from the coded data bit stream. A potential value of the extracted bit sequence is then computed using the basic parameters of the codewords in the Huffman codebook. The sorted Huffman codebook is then searched to find a computed potential value in the sorted Huffman codebook that is substantially close to the computed potential value of the extracted bit sequence. The extracted current bit sequence is decoded based on the outcome of the search.

17 Claims, 2 Drawing Sheets

SYSTEM AND METHOD FOR STATIC HUFFMAN DECODING

FIELD OF THE INVENTION

This invention relates to the field of data compression, and more specifically to a system and method of decoding Huffman-encoded codewords.

BACKGROUND OF THE INVENTION

Huffman codes are widely used in the area of data compression and telecommunications. Some applications include JPEG picture compression and MPEG video and audio compression. Huffman codes are of variable word length, which means that the individual symbols used to compose a message are represented (encoded) each by a distinct bit sequence of distinct length. This characteristic of the codewords helps to decrease the amount of redundancy in message data, i.e., it makes data compression possible.

The use of Huffman codes affords compression, because distinct symbols have distinct probabilities of incidence. This property is used to advantage by tailoring the code lengths corresponding to those symbols in accordance with their respective probabilities of occurrence. Symbols with higher probabilities of incidence are coded with shorter codewords, while symbols with lower probabilities are coded with longer codewords. However, longer codewords still show up, but tend to be less frequent and hence the overall code length of all codewords in a typical bit string tends to be smaller due to the Huffman coding.

A basic difficulty in decoding Huffman codes is that the decoder cannot know at first the length of an incoming codeword. As previously explained, Huffman codes are of variable length codes. Huffman codes can be detected extremely fast by dedicating enormous amounts of memory. For a set of Huffman codewords with a maximum word length of N bits, $2^N$ memory locations are needed, because N incoming bits are used as an address into the lookup table to find the corresponding codewords.

A technique requiring less memory is currently performed using bit-by-bit decoding, which proceeds as follows. One bit is taken and compared to all the possible codes with a word length of one. If a match is not found, another bit is shifted in to try to find the bit pair from among all the codewords with word length of two. This is continued until a match is found. Although this approach is very memory-efficient, it is very slow, especially if the codeword being decoded is long.

Another technique is the binary tree search method. In this implementation technique, Huffman tables used should be converted in the form of binary trees. A binary tree is a finite set of elements that is either empty or partitioned into three disjoint subsets. The first subset contains a single element called the root of the tree. The other two subsets are referred to as left and right sub trees of the original tree. Each element of a binary tree is called a node of the tree. A branch connects two nodes. Nodes without any branches are called leaves. Huffman decoding for a symbol search begins at the root of a binary tree and ends at any of the leaves; one bit for each node is extracted from bit-stream while traversing the binary tree. This method is a compromise between memory requirement and the number of Huffman code searches as compared to the above two methods. In addition, the coding speed of this technique will be down by a factor related to maximum length of Huffman code.

Another technique currently used to decode Huffman codes is to use canonical Huffman codes. The canonical Huffman codes are of special interest since they make decoding easier. They are generally used in multimedia and telecommunications. They reduce memory and decoding complexity. However, most of these techniques use a special tree structure in the Huffman codeword tables for encoding and hence are suitable only for a special class of Huffman codes and are generally not suitable for decoding a generic class of Huffman codes.

As indicated in the above examples, a problem with using variable codeword lengths is the difficulty in achieving balance between speed and reasonable memory usage.

SUMMARY OF THE INVENTION

According to a first aspect of the invention there is provided a method of Huffman decoding, the method comprising the steps of:
  a) sorting codewords in a Huffman codebook based on associated potential values, wherein the potential values are computed using basic parameters of the codewords in the Huffman codebook;
  b) extracting a current bit sequence having a predetermined length from a coded bit stream having a plurality of variable length codewords based on the Huffman codebook;
  c) computing a potential value of the extracted current bit sequence based on the basic parameters of the codewords of the Huffman codebook;
  d) performing a search for finding the computed potential value in the sorted Huffman codebook that is substantially close to the computed potential value of the extracted current bit sequence; and
  e) decoding the extracted current bit sequence as a function of the binary search.

Preferably, the potential value of each codeword in the Huffman codebook is computed exponentially weighing down each bit in each codeword and summing all summing all resulting weighted down bit values. Preferably, the bits in the codeword are exponentially weighted down from left to right.

According to a second aspect of the invention there is provided an article including a storage medium having instructions that, when executed by a computing platform, result in execution of a method for syllable input, the method comprising the steps of:
  a) sorting codewords in a Huffman codebook based on associated potential values, wherein the potential values are computed using basic parameters of the codewords in the Huffman codebook;
  b) extracting a current bit sequence having a predetermined length from a coded bit stream having a plurality of variable length codewords based on the Huffman codebook;
  c) computing a potential value of the extracted current bit sequence based on the basic parameters of the codewords of the Huffman codebook;
  d) performing a search for finding the computed potential value in the sorted Huffman codebook that is substantially close to the computed potential value of the extracted current bit sequence; and
  e) decoding the extracted current bit sequence as a function of the binary search.

According to a third aspect of the invention there is provided a system for static Huffman decoding, the system comprising:

a) a network interface;
b) an input module coupled to the network interface to receive a coded bit stream having a plurality of variable length codewords based on a Huffman codebook via the network interface;
c) a decoder coupled to the input module; and
d) a memory operatively coupled to the decoder that stores a Huffman codebook,
   wherein the decoder computes potential values of each codeword in the Huffman codebook based on parameters of the codewords in the Huffman codebook,
   wherein the decoder sorts codewords in the Huffman codebook based on the computed potential values,
   wherein the decoder extracts a current bit sequence having a predetermined length from the received coded bit stream,
   wherein the decoder computes a potential value of the extracted current bit sequence based on the parameters of the codewords of the Huffman codebook,
   wherein the decoder performs a binary search to find the computed potential value in the sorted Huffman codebook that is substantially close to the computed potential value of the extracted current bit sequence, and
   wherein the decoder decodes the extracted current bit sequence as a function of the binary search.

DESCRIPTION OF PREFERRED EMBODIMENTS

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component which appears in multiple Figures. The same reference number or label may refer to signals and connections, and the actual meaning will be clear from its use in the context of the description.

Terminology

The term "binary search" means a logarithmic search algorithm used on a sorted table, such as the "Huffman codebook" in which the table is split into two halves during each step of the search, with the search continuing in only one of the halves, thereby resulting in $((\log_2(n))+1)$ number of searches. Generally, such a logarithmic search is considerably faster than a linear search.

Figure 1:
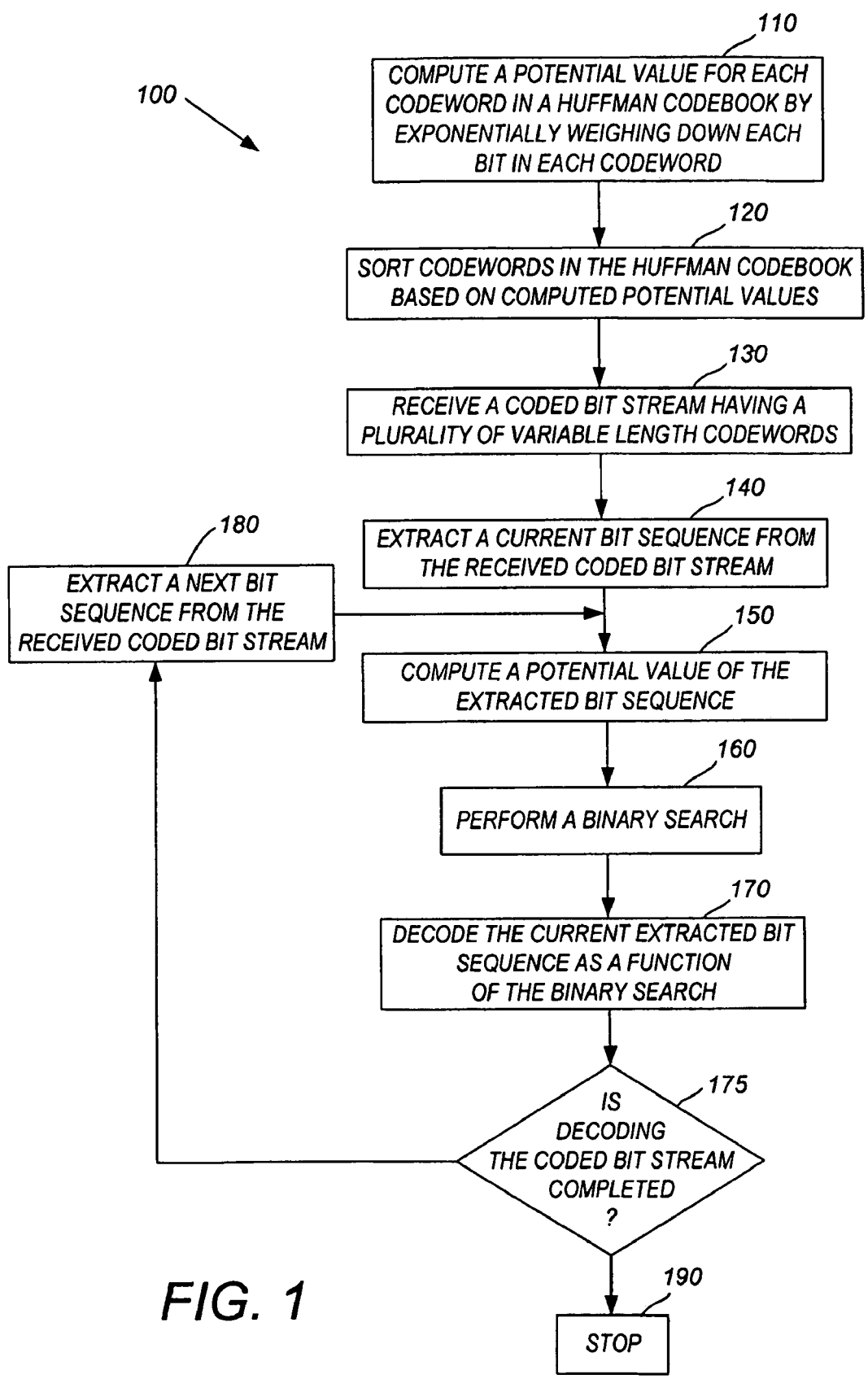
FIG. 1 is a flowchart illustrating an example of Huffman decoding according to an embodiment of the present invention.

FIG. 1 illustrates an example method 100 of decoding. At 110, the method 100 computes a potential value for each codeword in a Huffman codebook. The potential value of each codeword is computed using basic parameters of the codewords in the Huffman codebook. In one embodiment, the potential value of each codeword is computed by exponentially weighing down each bit in a codeword and summing all of the resulting weighted down values to obtain a potential value for the codeword. In these embodiments, bits in each codeword are weighted down from left to right.

In some embodiments, the potential value of each codeword in the Huffman codebook is computed using the equation:

$$P(s1) = b_1 * 2^{(N+M)} + b_2 * 2^{((N-1)+M)} + \ldots + b_n * 2^{((N-(N-1))+M)}$$

Wherein P is the computed potential value of a codeword s1 in the Huffman codebook, $b_1, b_2 \ldots b_n$ are binary bit values in each codeword, N is the highest number of bits found in a codeword amongst all of the codewords in the Huffman codebook, and M is the highest number of preceding zeros found in a codeword amongst all of the codewords in the Huffman codebook.

The following example illustrates the computation of the potential values of the codewords in a Huffman codebook using the above equation:

The table below illustrates a simplified Huffman code book.

| Codeword | Binary representation |
| --- | --- |
| a1 | 111 |
| a2 | 01 |
| a3 | 101 |
| a4 | 1100 |
| a5 | 1101 |
| a6 | 001 |
| a7 | 0001 |

In the above table, the values of the codeword parameters are N=4 and M=3, i.e., 4 being the highest number of bits found in a codeword amongst all of the codewords in the above Huffman codebook and 3 being the highest number of preceding zeros found in a codeword amongst all of the codewords in the above Huffman codebook, respectively.

The following table illustrates the computation of the potential value for each codeword in the above table using the equation shown earlier.

| Codeword name | Potential computation | Codeword in binary format | Computed potential value |
| --- | --- | --- | --- |
| a1 | $1*2^7+1*2^6+1*2^5$ | 111 | 224 |
| a2 | $0*2^7+1*2^6$ | 01 | 64 |
| a3 | $1*2^7+0*2^6+1*2^5$ | 101 | 160 |
| a4 | $1*2^7+1*2^6+0*2^5+0*2^4$ | 1100 | 192 |
| a5 | $1*2^7+1*2^6+0*2^5+1*2^4$ | 1101 | 208 |
| a6 | $0*2^7+0*2^6+1*2^5$ | 001 | 32 |
| a7 | $0*2^7+0*2^6+0*2^5+1*2^4$ | 0001 | 16 |

At 120, the codewords in the Huffman table are sorted based on the computed potential values. In some embodiments, the codewords are sorted either in ascending or descending order of the computer potential values. The table below illustrates, the codewords sorted in a descending order of the computed potential values, by our running example.

| Codeword | Codeword in binary format | Potential value |
| --- | --- | --- |
| a1 | 111 | 224 |
| a5 | 1101 | 208 |
| a4 | 1100 | 192 |
| a3 | 101 | 160 |
| a2 | 01 | 64 |
| a6 | 001 | 32 |
| a7 | 0001 | 16 |

At 130, a coded bit stream having a plurality of variable codewords based on Huffman codebook is received. The following illustrates an example of a received coded bit stream including the codewords shown in the above Huffman table.

U[1011100001011110001], wherein U being the coded bit stream.

The above example of the received coded stream basically includes the codewords [a3, a4, a6, a2, a1, and a7] shown in the above Huffman table. The problem with such a coded stream which includes the codewords shown in the above Huffman table is that the lengths of these codewords are not known at the time of decoding. In such a coded stream, the difficulty generally lies in decoding the coded stream using efficient computational techniques without using a large amount of memory.

At 140, a current bit sequence having a predetermined length is extracted from the received coded bit stream. In these embodiments, the current bit sequence is extracted starting from the left side of the coded bit stream because the coded bit stream is generally received from left to right as shown in the above example. Also in these embodiments, the predetermined length is equal to a highest number of bits in a codeword amongst all of the codewords in the Huffman codebook.

In our running example above, the predetermined length will be equal to 4, as the highest number of bits in the codewords listed in the above Huffman table is 4. Therefore, the current bit sequence extracted in the above received coded bit stream will be "1011", i.e., the bit sequence is extracted starting from left to right as described earlier.

At 150, a potential value is computed for the extracted current bit sequence. In some embodiments, the potential value is computed using the equation shown above. In our running example, N=4 and M=3, as the highest number of bits in the codewords amongst all the codewords in the Huffman table is equal to 4 and the highest number of preceding zeros in the codewords amongst all the codewords in the Huffman table is equal to 3, respectively. Using these values for M and N, the potential value of the extracted bit sequence of 1011 is computed as below:

$P(es1) = 1*2^7 + 0*2^6 + 1*2^5 + 1*2^4 = 176$, wherein P(es1) represents the potential value of the extracted bit sequence.

At 160, the sorted potential values in the Huffman codebook are searched by using the computed potential value of the extracted current bit sequence to find a potential value in the Huffman codebook, that is substantially close to the computed potential value of the extracted current bit sequence. In some embodiments, a binary search is performed on the sorted potential values in the Huffman codebook to find the computed potential value in the Huffman codebook that is substantially close to the computed potential value of the extracted bit sequence.

In our running example, the binary search is performed as follows to find a potential value in the sorted Huffman table that is substantially close to the computed potential value of the extracted current bit sequence.

Finding a mid location in the above Huffman codebook. The mid location is computed using the equation $N\_1 =$ (number of codewords in the Huffman table/2), i.e., in our running example $N\_1 = hu \lfloor 7/2 \rfloor = 3$.

Extracting an associated potential value at this mid location. In our running example it will be 192.

Checking if the extracted potential value at the mid location of the Huffman table is greater than the computed potential value of the current bit sequence. In our running example, the extracted potential value from the Huffman table 192 is greater than the computed potential value of the current bit sequence 176. Therefore, the search continues in the lower half of the table by repeating the above steps until the search ends in the Huffman table. In our running example, the above performed binary search ends at codeword 101 having the computed potential value P(c1) being equal to 160.

In the sorted Huffman table the computed potential value of the codeword just above the codeword corresponding to the potential value P(c1) being equal to 160 obtained after completing the binary search as being P(ck) equal to 192.

At 170, the extracted current bit sequence is decoded using the following criteria:

If P(ck)<=P(es1), then the codeword for the extracted bit sequence is assigned as equal to the codeword associated with the computed potential value of P(ck). If P(ck)>P(es1) and P(ck)>P(c1), then the codeword for the extracted bit sequence is assigned as equal to the codeword associated with the potential value of P(c1).

In our running example, since P(ck)>P(es1) and P(ck)>P(c1), i.e., 192>178 and 192>160, the potential value of the extracted bit sequence will be assigned as equal to the potential of P(c1), which therefore is equal to 160. The extracted bit sequence of 1011 is then decoded as codeword a3 by using the above assigned potential value of 160.

At 175, the received coded stream is checked to see if the decoding of the received bit stream is completed. If the decoding is completed, then the method 100 goes to act 190 and stops the decoding process. If the decoding is not completed, then the method 100 goes to act 180 and extracts a next bit sequence from the received coded bit stream and repeats the above described acts 150–190. In our running example, since only three bits of the current extracted bit are decoded (because the decoded codeword a3 corresponds to Huffman code of 101 in the Huffman table), the remaining 1 bit in the extracted bit sequence of 1011 is added back into the received coded bit stream and the next bit sequence of 1100 is extracted from the remaining coded bit stream and decoded by repeating the above-described acts 150–190.

Although the flowchart 100 includes steps 110–190 that are arranged serially in the exemplary embodiments, other embodiments of the subject matter may be implemented using multiple processors or a single processor organized as two or more virtual machines or sub-processors. Moreover, still other embodiments may implement the steps as two or more specific interconnected hardware modules with related control and data signals communicated between and through the modules, or as portions of an application-specific integrated circuit. Thus, the exemplary process flow diagrams are applicable to software, firmware, and/or hardware implementations.

Various embodiments of the present invention can be implemented in software, which may be run in the environment shown in FIG. 2 (to be described below) or in any other suitable computing environment. The embodiments of the present invention are operable in a number of general-purpose or special-purpose computing environments. Some computing environments include personal computers, general-purpose computers, server computers, hand-held devices (including, but not limited to, telephones and personal digital assistants (PDAs) of all types), laptop devices, multi-processors, microprocessors, set-top boxes, programmable consumer electronics, network computers, minicomputers, mainframe computers, distributed computing environments and the like to execute code stored on a computer-readable medium. The embodiments of the present invention may be implemented in part or in whole as machine-executable instructions, such as program modules that are executed by a computer. Generally, program modules include routines, programs, objects, components, data structures, and the like to perform particular tasks or to implement particular abstract data types. In a distributed computing environment, program modules may be located in local or remote storage devices.

Figure 2:
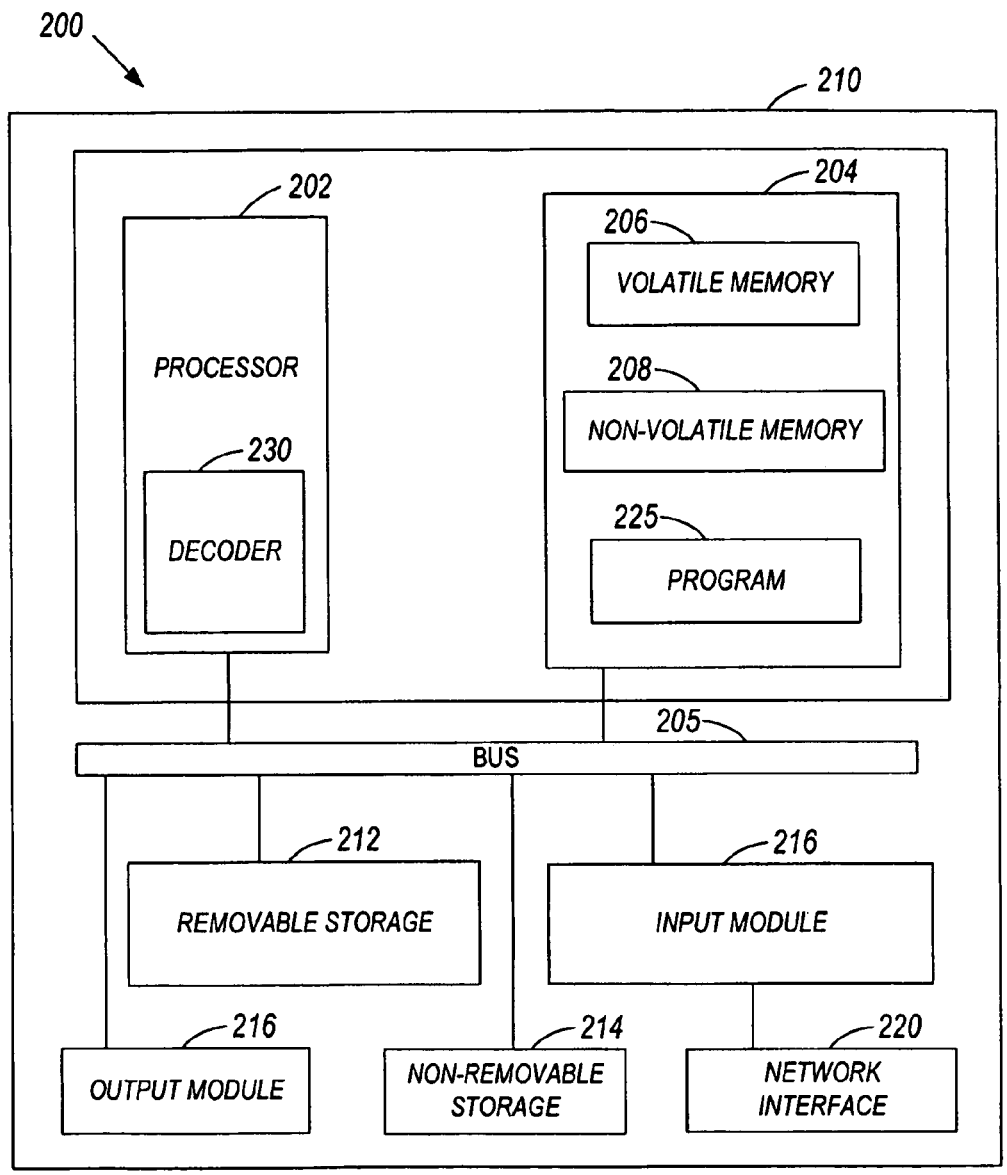
FIG. 2 is a block diagram of a typical computer system that can be used to run some or all portions of the present invention.

FIG. 2 shows an example of a suitable computing system environment for implementing embodiments of the present invention. FIG. 2 and the following discussion are intended to provide a brief, general description of a suitable computing environment in which certain embodiments of the inventive concepts contained herein may be implemented.

A general computing device, in the form of a computer 210, may include a processor 202, memory 204, removable storage 212, and non-removable storage 214. Computer 210 additionally includes a bus 205 and a network interface (NI) 201. The processor 202 may include a decoder 230.

The computer 210 may include or have access to a computing environment that includes one or more user input devices 216 and one or more output devices 218. The user input device 216 can include a keyboard, mouse, trackball, cursor detection keys, and/or the like. The output device 218 can include a computer display device and the like. The network interface 201 can be a USB connection. The computer 210 may operate in a networked environment using the network interface 201 to connect to one or more remote computers via Internet. The remote computer may include a personal computer, server, router, network PC, a peer device or other network node, and/or the like. The network interface 201 can also include a Local Area Network (LAN), a Wide Area Network (WAN), and/or other networks.

The memory 204 may include volatile memory 206 and non-volatile memory 208. The memory 204 stores a Huffman codebook. A variety of computer-readable media may be stored in and accessed from the memory elements of computer 210, such as volatile memory 206 and non-volatile memory 208, removable storage 212 and non-removable storage 214. Computer memory elements can include any suitable memory device(s) for storing data and machine-readable instructions, such as read only memory (ROM), random access memory (RAM), erasable programmable read only memory (EPROM), electrically erasable programmable read only memory (EEPROM), hard drive, removable media drive for handling compact disks (CDs), digital video disks (DVDs), diskettes, magnetic tape cartridges, memory cards, Memory Sticks, and the like; chemical storage; biological storage; and other types of data storage.

"Processor" or "processing unit," as used herein, means any type of computational circuit, such as, but not limited to, a microprocessor, a microcontroller, a complex instruction set computing (CISC) microprocessor, a reduced instruction set computing (RISC) microprocessor, a very long instruction word (VLIW) microprocessor, explicitly parallel instruction computing (EPIC) microprocessor, a graphics processor, a digital signal processor, or any other type of processor or processing circuit. The term also includes embedded controllers, such as generic or programmable logic devices or arrays, application specific integrated circuits, single-chip computers, smart cards, and the like. The "computer" 210 as used herein, means a computer system using a Unix operating system.

Embodiments of the present invention may be implemented in conjunction with program modules, including functions, procedures, data structures, application programs, etc., for performing tasks, or defining abstract data types or low-level hardware contexts.

Machine-readable instructions stored on any of the above-mentioned storage media are executable by the processor 202 of the computer 210. For example, a computer program 225 may comprise machine-readable instructions capable of Huffman decoding according to the teachings and herein described embodiments of the present invention. In one embodiment, the computer program 225 may be included on a CD-ROM and loaded from the CD-ROM to a hard drive in non-volatile memory 208. The machine-readable instructions cause the computer 210 to decode Huffman codewords according to the embodiments of the present invention.

In operation, the input module 216 receives a coded bit stream having a plurality of variable length codewords based on the Huffman codebook via the network interface. The decoder 230 computes potential values of each codeword in the Huffman codebook based on parameters of the codewords in the Huffman codebook. The decoder 230 then sorts the codewords in the Huffman codebook based on the computed potential values. The decoder 230 extracts a current bit sequence having a predetermined length from the received coded bit stream. The decoder 230 then computes a potential value of the extracted current bit sequence based on the parameters of the codewords of the Huffman codebook. The decoder 230 then performs a binary search to find the computed potential value in the sorted Huffman codebook that is substantially close to the computed potential value of the extracted current bit sequence. The decoder 230 then decodes the current extracted coded bit sequence based on the outcome of the binary search.

In some embodiment, the decoder 230 computes the potential value of each codeword in the Huffman codebook using the equation:

$$P(s1) = b_1 * 2^{(N+M)} + b_2 * 2^{((N-1)+M)} + \ldots + bn * 2^{((N-(N-1))+M)}$$

Wherein P is the computed potential value of a codeword s1 in the Huffman codebook, $b_1, b_2 \ldots b_n$ are binary bit values in each codeword, N is the highest number of bits found in a codeword amongst all of the codewords in the Huffman codebook, and M is the highest number of preceding zeros found in a codeword amongst all of the codewords in the Huffman codebook.

The operation of the decoder to decode the received coded bit stream is explained in more detail with reference to FIG. 1.

The communication technique of the present invention is modular and flexible in terms of usage in the form of a "Distributed Configurable Architecture". As a result, parts of the Unix framework may be placed at different points of a network, depending on the model chosen. For example, the technique can be deployed in a server and the input and output modules can be streamed over from a client to the server and back, respectively.

The proposed technique uses basic properties of a Huffman codebook to decode a coded data bit stream having a plurality of variable length codewords based on the Huffman codebook. Also, the proposed technique reduces the computational complexity in decoding the received data bit stream by using the binary search technique to reduce the number of searches required in decoding an extracted bit sequence to $((\log_2(n))+1)$ searches. Further, the proposed technique does not use any special tree structures in the Huffman codeword tables for decoding and hence are suitable for decoding the generic class of Huffman codes.

The above description is intended to be illustrative, and not restrictive. Many other embodiments will be apparent to those skilled in the art. The scope of the invention should therefore be determined by the appended claims, along with the full scope of equivalents to which such claims are entitled.

It is to be understood that the above-description is intended to be illustrative, and not restrictive. Many other embodiments will be apparent to those of skill in the art upon reviewing the above-description. The scope of the subject matter should, therefore, be determined with reference to the following claims, along with the full scope of equivalents to which such claims are entitled.

As shown herein, the present invention can be implemented in a number of different embodiments, including various methods, a circuit, an I/O device, a system, and an article comprising a machine-accessible medium having associated instructions.

Other embodiments will be readily apparent to those of ordinary skill in the art. The elements, algorithms, and sequence of operations can all be varied to suit particular requirements. The operations described-above with respect to the method illustrated in FIG. 2 can be performed in a different order from those shown and described herein.

FIGS. 1 and 2 are merely representational and are not drawn to scale. Certain portions thereof may be exaggerated, while others may be minimized. FIGS. 1–2 illustrate various embodiments of the invention that can be understood and appropriately carried out by those of ordinary skill in the art.

It is emphasized that the Abstract is provided to comply with 37 C.F.R. § 1.72(b) requiring an Abstract that will allow the reader to quickly ascertain the nature and gist of the technical disclosure. It is submitted with the understanding that it will not be used to interpret or limit the scope or meaning of the claims.

In the foregoing detailed description of embodiments of the invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus, the following claims are hereby incorporated into the detailed description of embodiments of the invention, with each claim standing on its own as a separate embodiment.

It is understood that the above description is intended to be illustrative, and not restrictive. It is intended to cover all alternatives, modifications and equivalents as may be included within the spirit and scope of the invention as defined in the appended claims. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein," respectively.

What is claimed is:

1. A method comprising:
   sorting codewords in a Huffman codebook based on associated potential values, wherein the potential values are computed using basic parameters of the codewords in the Huffman codebook;
   extracting a current bit sequence having a predetermined length from a coded bit stream having a plurality of variable length codewords based on the Huffman codebook;
   computing a potential value of the extracted current bit sequence based on the basic parameters of the codewords of the Huffman codebook;
   performing a search for finding the computed potential value in the sorted Huffman codebook that is substantially close to the computed potential value of the extracted current bit sequence; and
   decoding the extracted current bit sequence as a function of the binary search.

2. The method of claim 1, further comprising:
   computing a potential value for each codeword in the Huffman codebook by exponentially weighing down each bit in each codeword and summing all resulting weighted down bit values, wherein the bits in the codeword are weighted down from left to right.

3. The method of claim 1, wherein the potential value of each codeword in the Huffman codebook is computed using the equation:

$$P(s1) = b_1 * 2^{(N+M)} + b_2 * 2^{((N-1)+M)} + \ldots + bn * 2^{((N-(N-1))+M)}$$

wherein P is the computed potential value of a codeword s1 in the Huffman codebook, $b_1, b_2 \ldots b_n$ are binary bit values in each codeword, N is highest number of bits found in a codeword amongst all the codewords in the Huffman codebook, and M is highest number of preceding zeros found in a codeword amongst all the codewords in the Huffman codebook.

4. The method of claim 1, wherein sorting the codewords in the Huffman codebook based on associated computed potential values comprise:
   sorting the codewords in the Huffman codebook such that the associated computed potential values are in an order selected from the group consisting of ascending order and descending order.

5. The method of claim 1, wherein extracting the current bit sequence having the predetermined length from the coded bit stream comprises:
   receiving a coded bit stream having plurality of variable length codewords based on the Huffman codebook; and
   extracting the current bit sequence from the received coded bit stream, wherein the extracted current bit sequence having a length equal to a highest number of bits found in a codeword amongst all the codewords in the Huffman codebook.

6. The method of claim 1, wherein computing the potential value of the extracted current bit sequence comprises:

$$P = b_1 * 2^{(N+M)} + b_2 * 2^{((N-1)+M)} + \ldots + bn * 2^{((N-(N-1))+M)}$$

wherein P is the computed potential value of the extracted current bit sequence in the Huffman codebook, $b_1, b_2 \ldots b_n$ are binary bit values in the extracted current bit sequence codeword, N is highest number bits in a codeword amongst all the codewords in the Huffman codebook, and M is highest number of preceding zeros in a codeword amongst all the codewords in the Huffman codebook.

7. The method of claim 1, wherein performing the search for finding the computed potential value in the sorted Huffman codebook that is substantially close to the computed potential value of the extracted current bit sequence comprises:
performing a binary search for finding the computed potential value in the sorted Huffman codebook that is substantially close to the computed potential value of the extracted current bit sequence.

8. The method of claim 1, wherein decoding the extracted current bit sequence as a function of the binary search comprises:
determining a codeword name associated with the found computed potential value in the sorted Huffman codebook.

9. The method of claim 1, further comprising:
determining whether decoding is completed;
if not, extracting a next bit sequence having the predetermined length from the coded bit stream and repeating the above steps to decode the extracted next bit sequence; and
if so, ending the decoding.

10. An article comprising:
a storage medium having instructions that, when executed by a computing platform, result in execution of a method comprising:
sorting codewords in a Huffman codebook based on potential values, wherein the potential values are computed based on basic parameters of the codewords in the Huffman codebook;
extracting a current bit sequence having a predetermined length from a coded bit stream having a plurality of variable length codewords based on the Huffman codebook;
computing a potential value of the extracted current bit sequence based on the basic parameters of the codewords of the Huffman codebook;
performing a binary search for finding the computed potential value in the sorted Huffman codebook that is substantially close to the computed potential value of the extracted current bit sequence; and
decoding the extracted current bit sequence as a function of the binary search.

11. The article of claim 10, further comprising:
computing a potential value for each codeword in the Huffman codebook by exponentially weighing down each bit in each codeword and summing resulting weighted down bit values, wherein the bits are weighted down from left to right.

12. The article of claim 11, wherein the potential value of each codeword in the Huffman codebook is computed using the equation:

$$P(s1) = b_1 * 2^{(N+M)} + b_2 * 2^{((N-1)+M)} + \ldots + bn * 2^{((N-(N-))+M)}$$

wherein P is the computed potential value of a codeword s1 in the Huffman codebook, $b_1, b_2 \ldots b_n$ are binary bit values in each codeword, N is the highest number of bits found in a codeword amongst all the codewords in the Huffman codebook, and M is a highest number of preceding zeros found in a codeword amongst all the codewords in the Huffman codebook.

13. A system comprising:
a network interface;
an input module coupled to the network interface to receive a coded bit stream having a plurality of variable length codewords based on a Huffman codebook via the network interface;
a decoder coupled to the input module; and
a memory operatively coupled to the decoder that stores a Huffman codebook,
wherein the decoder computes potential values of each codeword in the Huffman codebook based on parameters of the codewords in the Huffman codebook,
wherein the decoder sorts codewords in the Huffman codebook based on the computed potential values,
wherein the decoder extracts a current bit sequence having a predetermined length from the received coded bit stream,
wherein the decoder computes a potential value of the extracted current bit sequence based on the parameters of the codewords of the Huffman codebook,
wherein the decoder performs a binary search to find the computed potential value in the sorted Huffman codebook that is substantially close to the computed potential value of the extracted current bit sequence, and
wherein the decoder decodes the extracted current bit sequence as a function of the binary search.

14. The system of claim 13, wherein the decoder computes the potential value of each codeword in the Huffman codebook using the equation:

$$P(s1) = b_1 * 2^{(N+M)} + b_2 * 2^{((N-1)+M)} + \ldots + bn * 2^{((N-(N-1)+M)}$$

wherein P is the computed potential value of a codeword s1 in the Huffman codebook, $b_1, b_2 \ldots b_n$ are binary bit values in each codeword, N is the highest number of bits found in a codeword amongst all the codewords in the Huffman codebook, and M is a highest number of preceding zeros found in a codeword amongst all the codewords in the Huffman codebook.

15. The system of claim 13, wherein the decoder sorts the codewords in the Huffman codebook such that the associated computed potential values are in an order selected from the group consisting of ascending order and descending order.

16. The system of claim 13, wherein the decoder computes the potential value of each codeword in the Huffman codebook by exponentially weighing down each bit in each codeword and sums resulting weighted down bit values, wherein the bits are weighted down from left to right.

17. The system of claim 13, wherein the decoder computes the potential value of extracted bit sequence using the equation:

$$P(s1) = b_1 * 2^{(N+M)} + b_2 * 2^{((N-1)+M)} + \ldots + bn * 2^{((N-(N-1))+M)}$$

wherein P is the computed potential value of a codeword s1 in the Huffman codebook, $b_1, b_2 \ldots b_n$ are binary bit values in each codeword, N is the highest number of bits found in a codeword amongst all the codewords in the Huffman codebook, and M is a highest number of preceding zeros found in a codeword amongst all the codewords in the Huffman codebook.

* * * * *